(12) United States Patent
Bahl

(10) Patent No.: US 11,406,024 B2
(45) Date of Patent: Aug. 2, 2022

(54) MULTI-LAYER CIRCUIT BOARD WITH TRACES THICKER THAN A CIRCUIT BOARD

(71) Applicant: CATLAM LLC, Sunnyvale, CA (US)

(72) Inventor: Kenneth S. Bahl, Saratoga, CA (US)

(73) Assignee: CATLAM, LLC, Sunnyvale, CA (US)

( * ) Notice: Subject to any disclaimer, the term of this patent is extended or adjusted under 35 U.S.C. 154(b) by 0 days.

(21) Appl. No.: 17/317,203

(22) Filed: May 11, 2021

(65) Prior Publication Data

US 2021/0282274 A1 Sep. 9, 2021

Related U.S. Application Data

(63) Continuation of application No. 16/237,702, filed on Jan. 1, 2019, now Pat. No. 11,039,540.

(51) Int. Cl.
*H05K 3/18* (2006.01)
*H05K 3/38* (2006.01)
*H05K 3/10* (2006.01)
*H05K 1/09* (2006.01)
*H05K 3/46* (2006.01)
*H05K 1/02* (2006.01)

(52) U.S. Cl.
CPC ............. *H05K 3/387* (2013.01); *H05K 1/09* (2013.01); *H05K 3/107* (2013.01); *H05K 3/182* (2013.01); *H05K 3/4644* (2013.01); *H05K 1/02* (2013.01); *H05K 1/0296* (2013.01); *H05K 2201/0154* (2013.01); *H05K 2201/0221* (2013.01); *H05K 2201/0224* (2013.01); *H05K 2201/0376* (2013.01); *H05K 2201/0379* (2013.01); *H05K 2201/09036* (2013.01); *H05K 2203/072* (2013.01)

(58) Field of Classification Search
CPC ............ H05K 3/107; H05K 3/12; H05K 3/18; H05K 3/181; H05K 3/182; H05K 3/184; H05K 3/185; H05K 3/187; H05K 3/188
See application file for complete search history.

(56) References Cited

U.S. PATENT DOCUMENTS

2016/0132146 A1\* 5/2016 Cok ...................... G06F 3/0446
345/174
2016/0240419 A1\* 8/2016 Sieber ............... C23C 16/45576

\* cited by examiner

*Primary Examiner* — Jeremy C Norris
(74) *Attorney, Agent, or Firm* — File-EE-Patents.com; Jay A. Chesavage

(57) ABSTRACT

A multi-layer circuit board is formed multiple layers of a catalytic layer, each catalytic layer having an exclusion depth below a surface, where the cataltic particles are of sufficient density to provide electroless deposition in channels formed in the surface. A first catalytic layer has channels formed which are plated with electroless copper. Each subsequent catalytic layer is bonded or laminated to an underlying catalytic layer, a channel is formed which extends through the catalytic layer to an underlying electroless copper trace, and electroless copper is deposited into the channel to electrically connect with the underlying electroless copper trace. In this manner, traces may be formed which have a thickness greater than the thickness of a single catalytic layer.

18 Claims, 6 Drawing Sheets

Catalytic Particle Distribution through Catalytic Layer

118: Catalytic Exclusion Depth ~1/2 catalytic particle mean size

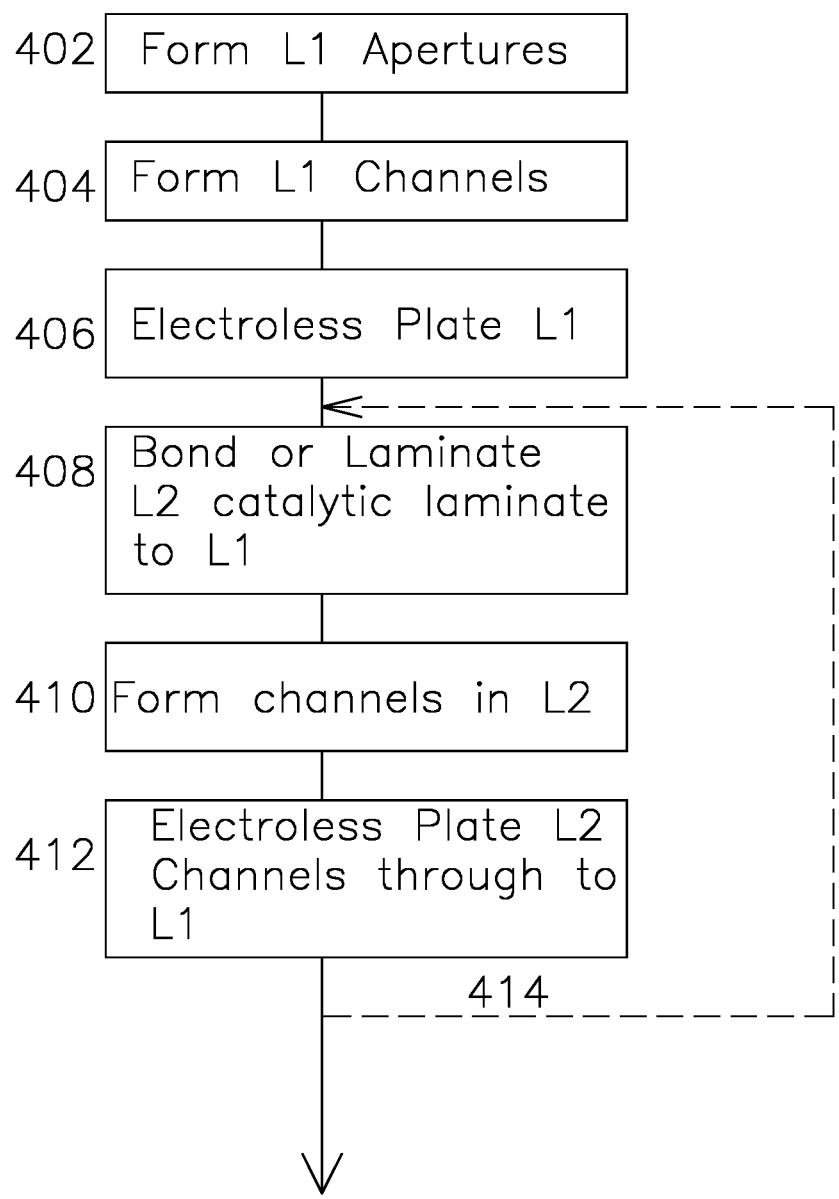

MULTI-LAYER CIRCUIT BOARD WITH TRACES THICKER THAN A CIRCUIT BOARD

FIELD OF THE INVENTION

The present invention relates to a multi-layer printed circuit board formed with at least two catalytic layers and having traces having a depth formed continuously across at least two catalytic layers using electroless deposition in channels formed in adjacent catalytic layers to form traces with dimensional thickness spanning more than one catalytic layer.

BACKGROUND OF THE INVENTION

Prior art printed circuit boards (PCB) are formed using a subtractive process by etching a sheet of copper laminated to a substrate using patterned resist to form conductive metal interconnects (known as "traces") on the dielectric substrate, where each surface carrying conductors is known as a "layer". Each dielectric core has traces formed on one surface or on both surfaces, and by stacking several such dielectric cores having traces formed on one or more surfaces, and interspersed with bare dielectric layers, a multi-layer printed circuit may be formed by laminating them together under temperature and pressure. The dielectric substrate comprises an epoxy resin embedded in a fiber matrix such as glass fiber woven into a cloth. In one prior art fabrication method, copper is laminated onto the outer surfaces of a dielectric layer, the copper surfaces are patterned such as with a photoresist or photo sensitive film to create masked and unmasked regions, and then etched to form a conductive trace layer on one or both sides of the core dielectric. A stack of dielectric cores with conductive traces may then be laminated together to form a multi-layer circuit board, and any layer to layer trace interconnects made with vias, which are drilled holes plated with copper to form annular rings which provide connectivity from one layer to another.

Printed circuit boards (PCB) are typically used to provide conductive traces between various electronic components mounted on the PCB. The dimension of a trace which is parallel to the surface of the laminate is considered a trace width, and the dimension of a trace which is perpendicular to the surface of the laminate is considered a trace thickness. One type of electronic component is a through-hole device which is mounted on the PCB by having leads positioned through one or more holes in the PCB, where the PCB hole includes a conductive annular ring pad on each trace connect layer, and the component lead is soldered to the annular ring pad of the PCB hole. Through hole components have leads which tend to be difficult to align with the associated PCB mounting hole, but surface mount technology (SMT) provides a preferable mounting system, where component leads are simply placed on the surface of a PCB pad or land and soldered, which is preferred for PCB assembly because of the smaller size and higher density of SMT components and ease of mechanized assembly compared to through-hole components. Surface mount components require only surface mount pads which provide a surface soldering terminal on an outside finished PCB layer. Within a two layer or multi-layer PCB, interconnects of conductive traces from one layer to another are accomplished using through-hole vias, where a conductive trace on one trace layer leads to a hole which is typically drilled through one or more dielectric layers of the PCB and plated with copper or other conductive metal to complete the trace layer connection. A hole drilled through all dielectric layers is known as a thru-via, a hole drilled through an outer layer only (typically as part of the fabrication of the individual layer) is known as a micro-via, and a hole drilled through one or more inner layers is known as a blind via. For any of these via types, the via is patterned to include an annular ring conductor region on opposite trace layers of the PCB, with the drilled hole lined with conductive material which connects the annular ring conductors on either side of the laminate or PCB.

The thickness of pre-patterned or post-patterned copper on a printed circuit board laminate may be increased using electroplating, where the PCB or dielectric layer with traces is placed in an electrolytic bath, and a DC source is connected between a sacrificial anodic conductor electrode (such as a copper rod) to an electrode clamped or attached to an existing conductive layer of a PCB which forms the two electrodes across which a DC current may be applied. Where a pre-existing conductive copper layer is not present on a PCB to facilitate electroplating, such as the case of bare dielectric material or drilled via holes, a seed layer of copper must first be deposited. This is done using an electroless process with the assistance of a "seed" catalytic material (which enhances the deposition of a particular conductive material) which is deposited on the surface of the dielectric, and the board is then placed in an electroless bath. For a catalyst such as palladium and an electroless bath of copper, the copper ions in solution deposit over the palladium until the surface is covered sufficiently to provide uniform electrical conductivity, after which the copper deposited using the electroless process provides a conductive scaffold for the subsequent addition of material using the electroplating process. Electroplating is preferred for finishing the plating operation, as it has a faster deposition rate than the electroless plating process.

As electronic assemblies increase in complexity, it is desired to increase component densities on PCB assemblies, such as by using smaller trace widths (known as fine pitch traces) in conjunction with increasingly dense integrated circuit (IC) lead patterns. One problem of prior art surface mount PCB fabrication and assembly methods is that because the traces are formed on the surface of the dielectric, the adhesion between copper trace and underlying laminate for narrower conductor line widths (known as fine pitch traces) is reduced, causing the fine pitch traces and component pads to separate (lift) during a component replacement operation, ruining the entire circuit board assembly and expensive components on it. Another problem of fine pitch surface traces is that when fabricating a multi-layer circuit board, the individual trace layers are laminated together under pressure in an elevated temperature environment. During lamination, fine pitch traces tend to migrate laterally across the surface of the dielectric. In high speed circuit board layout and design, it is desired to maintain a fixed impedance between traces, particularly for differential pair (edge coupled) transmission lines. This lateral migration of traces during lamination causes the transmission line impedance of the finished PCB differential pair to vary over the length of the trace, which causes reflections and losses in the transmission line compared to one with fixed impedance characteristics resulting from constant spacing.

Where traces are formed using subtractive processes such as etching a copper foil surface layer to form traces, lower resistance traces can be formed using electroplating to build up the thickness of the traces on the outer surface to reduce the trace resistance, or by widening the traces on the top surface to reduce the current density in the trace. However, it becomes difficult to electroplate more than 3 oz of copper because of bleeding of the copper to surrounding areas, and width increase of the traces, limiting the thickness of the copper which can be electroplated. Typically, the trace is made wider during the design of the circuit board, which consumes available real estate on the board, or the trace is replicated onto lower trace layers to form parallel traces on separate inner trace layers separated by dielectric, where the inner layers are typically formed from thinner base copper such as ½ oz copper (~0.5 mil thick). Alternatively, traces may be formed in channels using the applicant's additive process as described in U.S. Pat. Nos. 9,706,650, 9,380,700, 9,674,967, and 9,631,279. It is similarly possible to extend the width of these additive process traces formed in a channel to reduce trace resistance, subject to the same limitation of increasing the width of the trace to support greater current density. It is desired to provide traces with lower resistance than is provided by the prior art processes, and without increasing the width of the trace.

OBJECTS OF THE INVENTION

A first object of the invention is a circuit board having a first catalytic layer formed from either a catalytic laminate or catalytic adhesive, with a trace having a width and depth, the trace formed in a channel which is filled with a conductive metal using electroless deposition, the first catalytic layer laminated to a second catalytic layer formed from either a catalytic laminate or catalytic adhesive, the second catalytic layer having a channel formed through the thickness of the second catalytic layer to the trace of the first catalytic layer, the channel filled with a conductive metal such as from electroless deposition to form a circuit board with an elongated trace which has greater depth than the thickness of a single layer of a circuit board and having an elongated trace span, and with the electroless deposition of the first catalytic layer in electrical contact with the electroless deposition of the second catalytic layer.

A second object of the invention is a process for forming a circuit board, the process comprising:

forming a channel having a width and a depth into a first catalytic layer formed from either a catalytic laminate or a catalytic adhesive;

electroless plating a conductive trace into the first catalytic layer;

laminating a second catalytic layer formed from either a catalytic laminate or a catalytic adhesive to the first catalytic layer;

forming a channel having a width and a depth into the second catalytic layer, the channel depth reaching the conductive trace of the first catalytic layer;

electroless plating a conductive trace into the second catalytic layer which is in electrical contact with the conductive trace of the first catalytic layer.

A third object of the invention is a multi-layer circuit board having at least one trace formed in a first catalytic layer formed from either a catalytic laminate or catalytic adhesive, the first catalytic layer having a channel which is filled with an electroless deposition of a conductive metal, the first catalytic layer adjacent to subsequent adjacent catalytic layers, each adjacent catalytic layer formed from a catalytic adhesive or catalytic laminate and bonded or laminated to a previous catalytic layer and having a channel formed and deposited with electroless metal into the channel, the metal deposition extending into the electroless metal deposition of the previous adjacent layer, thereby forming a homogeneous trace with a trace depth which spans at least two catalytic layers.

SUMMARY OF THE INVENTION

In a first embodiment of the invention, a first catalytic layer formed from either a catalytic laminate or a catalytic adhesive has catalytic particles an exclusion depth below at least one surface of the catalytic layer, the catalytic layer having channels formed into at least one surface of the catalytic layer which have a depth of at least the exclusion depth, the channels thereby exposing catalytic particles. The channels of the first catalytic layer are exposed to electroless plating of a conductive metal such as copper for a duration of time sufficient for a deposition of metal with a thickness from the bottom of the channel to a depth near the surface of the first catalytic layer. The first catalytic layer is bonded or laminated to a second catalytic layer and at least one channel is formed into the second catalytic layer which extends through the thickness of the second catalytic layer and to the deposition of metal on the first catalytic layer, after which the second catalytic layer channel is electroless plated over a depth from the metal deposition of the first catalytic layer to the surface of the second catalytic layer, thereby forming a trace which has greater depth than a single catalytic layer. Additional catalytic layers may be bonded or laminated to previous catalytic layers, the additional catalytic layers each having full depth channels formed to the underlying metal deposition of an adjacent catalytic layer, with the electroless deposition plated to form traces having a trace depth which spans each additional catalytic layer to form traces with a depth which spans the several catalytic layers, each catalytic layer providing a full depth channel.

In a second embodiment of the invention, catalytic layers are formed as either catalytic laminates or catalytic adhesives. Catalytic laminates are formed by curing a mixture of a resin, catalytic particles, and a fiber mesh, the catalytic particles an exclusion depth below the surface of the catalytic laminate. Catalytic adhesives are formed as a mixture of resin and catalytic particles which are cured onto an underlying surface, the surface of the cured catalytic adhesive having catalytic particles an exclusion depth below the surface of the cured catalytic adhesive. In this embodiment, traces are formed having a depth of a plurality of catalytic layers, where a first catalytic layer has a channel formed, and the channel deposited with a metal using electroless plating to substantially fill the channel to a surface layer. The first catalytic layer is then bonded or laminated to one or more subsequent catalytic layers, each subsequent catalytic layer having a channel formed through the catalytic layer to the level of the first catalytic layer electroless plated metal, after which electroless copper is deposited in the channel to the surface of each subsequent layer, thereby providing traces continuous in depth over multiple catalytic layers, the resulting trace having a thickness greater than the thickness of a single catalytic layer, and spanning the depth of the multiple catalytic layers which form the trace. The lamination of a subsequent catalytic laminate to an underlying catalytic laminate layer with a formed channel may be performed with an electroless deposition after each lamination and channel forming step, or the channel may be formed through multiple catalytic laminate layers and electroless plated in a single step. In one example of the invention, the step of performing a sequential lamination of a catalytic laminate, forming a channel in the catalytic laminate after each lamination, and electroless plating each channel, are done in a repeating sequence until the desired trace depth is formed.

In a third embodiment of the invention, a process for forming traces in a catalytic layer formed from either catalytic laminate or a catalytic adhesive has at least one trace sequentially formed in a channel, the resultant trace having a thickness greater than the depth of a single catalytic layer, where the process comprises:

forming channels in one or more surfaces of a first catalytic layer to below the exclusion depth, thereby revealing catalytic particles;

electroless plating the channels with an electrically conductive metal to approximately the depth of the channel;

laminating or bonding one or more additional catalytic layers to the first catalytic layer;

forming a channel having a width and depth which extends through the thickness of the additional catalytic layer to the electroless metal deposition of the previous catalytic layer;

performing electroless deposition of conductive metal in the channel of each additional catalytic layer which is in electrical contact with the previously deposited electroless plating of an adjacent catalytic layer.

BRIEF DESCRIPTION OF THE DRAWINGS

FIG. 4 shows the processing steps for forming variable thickness trace layers using catalytic layers.

DETAILED DESCRIPTION OF THE INVENTION

Figure 1:
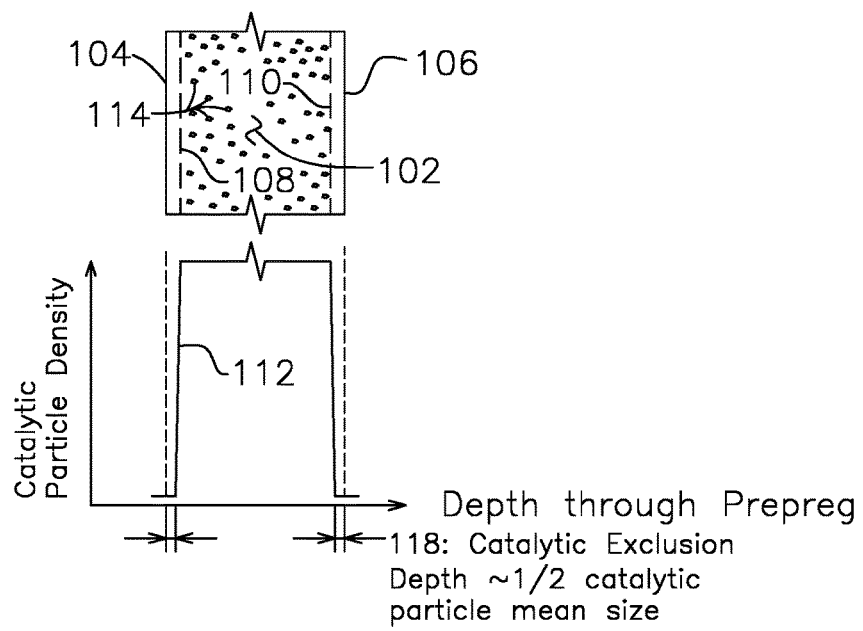
FIG. 1 shows a cross section and corresponding plot of catalytic particle distribution in a catalytic layer with respect to the section view of the catalytic layer.

FIG. 1 shows an example catalytic pre-preg for use in one aspect of the current invention. The catalytic pre-preg consists of a matrix of pre-impregnated fibers bound in a resin containing catalytic particles. Many different materials may be used for the fibers of pre-preg, including woven glass-fiber cloth, carbon-fiber, or other fibers, and a variety of different materials may be used for the resin, including epoxy resin, polyimide resin, cyanate ester resin, PTFE (Teflon) blend resin, or other resins. One aspect of the invention is a printed circuit board laminate capable of supporting fine pitch conductive traces on the order of 1 mil (25 u), and while the description is drawn to the formation of copper traces using catalysts for electroless copper formation, it is understood that the scope of the invention may be extended to other metals suitable for electroless plating and electro-plating. For electroless deposition of copper (Cu) channels, elemental palladium (Pd) is preferred as the catalyst, although selected periodic table transition metal elements, such as group 9 to 11 platinum (Pt), rhodium (Rh), iridium (Ir), nickel (Ni), gold (Au), silver (Ag), cobalt (Co), or copper (Cu), or other compounds of these, including other metals such as iron (Fe), manganese (Mn), chromium (Cr), molybdenum (Mo), tungsten (W), titanium (Ti), tin (Sn), or mixtures or salts of the above, any of which may be used as catalytic particles. The present candidate list is intended to be exemplar rather than comprehensive, it is known in the art that other catalysts for attracting copper ions may also be used. In one example of the invention, the catalytic particles are homogeneous catalytic particles. In another example of the invention, the catalytic particles are inorganic particles or high temperature resistant plastic particles which are coated with a few angstrom thickness of catalytic metal, thereby forming heterogeneous catalytic particles having a thin catalytic outer surface encapsulating a non-catalytic inner particle. This formulation may be desirable for larger catalytic particles, such as those on the order of 25 u in longest dimension. The heterogeneous catalytic particle of this formulation can comprise an inorganic, organic, or inert filler such as silicon dioxide (SiO2), an inorganic clay such as Kaolin, or a high temperature plastic filler coated on the surface with a catalyst such as palladium adsorbed onto the surface of the filler, such as by vapor deposition or chemical deposition. Only a few atomic layers of catalyst are required for the catalytic particle to have desirable properties conducive to electroless plating.

In another example of a catalytic layer formed using a catalytic adhesive, the catalytic adhesive formulation is the same as for the catalytic laminate except that no fiber is introduced into the resin and catalytic particle mixture and the resin and catalytic particle mixture is applied to an underlying surface and cured such that catalytic particles are an exclusion depth below the surface of the cured catalytic adhesive, as was the case with the catalytic particle distribution of the catalytic laminate layer, thereby enabling electroless plating only in channels which are formed which extend below the exclusion depth for catalytic particles.

In one example of forming heterogeneous catalytic particles, a bath of fillers (organic or inorganic) is sorted by size to include particles less than 25 u in size, these sorted inorganic particles are mixed into an aqueous bath in a tank, agitated, and then a palladium salt such as PdCl (or any other catalyst such as a salt of silver of other catalyst) is introduced with an acid such as HCl, and with a reducing agent such as hydrazine hydrate, the mixture thereby reducing metallic Pd which coats the inorganic particles provide a few angstroms of thickness of Pd coated on the filler, thereby creating a heterogeneous catalytic particle which has the catalytic property of a homogeneous Pd particle with a greatly reduced volume requirement of Pd compared to using homogeneous Pd metallic particles. For extremely small catalytic particles on the order of a few nm, however, homogeneous catalytic particles (such as pure Pd) may be preferred.

Example inorganic fillers include clay minerals such as hydrous aluminum phyllosilicates, which may contain variable amounts of iron, magnesium, alkali metals, alkaline earths, and other cations. This family of example inorganic fillers includes silicon dioxide, aluminum silicate, kaolinite ($Al_2Si_2O_5(OH)_4$), polysilicate, or other clay minerals which belong to the kaolin or china clay family. Example organic fillers include PTFE (Teflon) and other polymers with high temperature resistance.

Examples of palladium salts are: $BrPd$, $CL_2Pd$, $Pd(CN)_2$, $I_2Pd$, $Pd(NO_3)_2*2H_2O$, $Pd(NO_3)_2$, $PdSO_4$, $Pd(NH_3)$ $4Br_2$, $Pd(NH_3)$ $4Cl_2H_2O$. The catalytic powder of the present invention may also contain a mixture of heterogeneous catalytic particles (for example, catalytic materials coated over inorganic filler particles), homogeneous catalytic particles (such as elemental palladium), as well as non-catalytic particles (selected from the family of inorganic fillers).

Among the catalysts, palladium is a preferred catalyst because of comparative economy, availability, and mechanical properties, but other catalysts may be used.

In one method of forming catalytic laminates, a woven glass fiber is fed through as set of rollers infuse the fabric with epoxy resin blended with catalytic particles and mixed with a volatile liquid to reduce the viscosity, thereby forming an A-stage (liquid) pre-preg.

The resin may be a polyimide resin, a blend of epoxy and cyanide ester (which provides curing at elevated temperatures), or any other suitable resin formulation with selectable viscosity during coating and thermosetting properties after cooling. Fire retardants may be added, for example to comply with a flammability standard, or to be compatible with one of the standard FR series of pre-preg such as FR-4 or FR-10. An additional requirement for high speed electrical circuits is dielectric constant $\varepsilon$ (permittivity), which is often approximately 4 and governs the characteristic impedance of a transmission line formed on the dielectric, and loss tangent $\delta$, which is measure of frequency-dependent energy absorption over a distance, whereby the loss tangent is a measure of how the dielectric interacts with high frequency electric fields to undesirably reduce signal amplitude by a calculable amount of dB per cm of transmission line length. The resin is blended with catalytic particles which have been sorted for size. In one example formulation, the catalytic particles include at least one of: homogeneous catalytic particles (metallic palladium), or heterogeneous catalytic particles (palladium coated over an inorganic particle or high temperature plastic), and for either formulation, the catalytic particles preferably having a maximum extent of less than 25 u and with 50% of the particles by count sized between 12 u and 25 u, or the range 1-25 u, or smaller. These are example catalytic particle size embodiments not intended to limit the scope of the invention. In one example embodiment, the catalytic particles (either homogeneous or heterogeneous) are in the size range 1 u-25 u. In another example of the invention, homogeneous catalytic particles are formed by grinding metallic palladium into particles and passing the resultant particles through a sieve with a mesh having 25 u rectangular openings. In another example, the catalytic resin mixture is formed by blending homogeneous or heterogeneous catalytic particles into the pre-preg resin by a ratio of weights, such as the ratio of substantially 12% catalytic particles by weight to the weight of resin. The ratio by weight of catalytic particles in the resin mixture may alternatively be in the range of 8-16% of catalytic particle weight to the total weight of resin. It is understood that other blending ratios may also be used, and it may be preferable to use smaller particles. In one example of the invention, the catalytic particle density is chosen to provide a mean distance between catalytic particles on the order of 3 u-5 u.

In one example of the invention, to create the resin rich surface which excludes catalytic particles, the pre-preg sheets positioned near the outer surfaces (which will later have the surface removed to expose the underlying catalytic particles) are selected to have greater than 65% resin, such as Glass 106 (71% resin), Glass 1067, or Glass 1035 (65% resin), and the inner pre-preg sheets (which are not subject to surface removal) are selected to have less than 65% resin. Additionally, to reduce the likelihood of fiberglass being present near the surface of the catalytic pre-preg, a woven fiberglass may be used with the inner pre-preg layers and a flat unwoven fiberglass may be used in the outer resin rich pre-preg layers. The combination of resin-rich pre-preg and flat unwoven fiberglass on the outer surface layer results in an exclusion zone of 0.7 mil (17 u) to 0.9 mil (23 u) between an outer surface and the encapsulated fiberglass. Glass styles 106, 1035, and 1067 are preferred for use on the outer resin rich surface since the glass fiber thicknesses are smaller (1.3-1.4 mil/33-35 u) than the glass fiber thickness found in typical pre-preg sheets with greater than 65% resin used in the central regions of the laminate, such as glass style 2116, which has 3.7 mil (94 u) fibers. These values are given as examples, the smallest glass fibers which are commercially available are expected to continue to reduce in diameter. During processing of the catalytic laminate for use with the present invention, a temperature vs. time sequence is applied to cause the catalytic particles and fiberglass to migrate away from the outer surface of the laminate, repelled by the surface tension of the epoxy during a liquid state of the gel point temperature. After the cooling cycle, the cured C-stage pre-preg sheets are offloaded. The process which forms the cured C-stage pre-preg sheets may use single or multiple sheets of fiber fabric to vary the finished thickness, which may vary from 2 mil (51 u) to 60 mil (1.5 mm). A complete description of the process for forming catalytic laminates, catalytic adhesives, and resins may be found in U.S. Pat. No. 9,706,650 by the present inventors and commonly assigned, which is incorporated by reference.

FIG. 1 shows the resultant catalytic pre-preg 102 formed by the pre-preg process, where the catalytic particles 114 are distributed uniformly within the central region of pre-preg 102, but are not present below a boundary region 108 below first surface 104, or below boundary region 110 below second surface 106. This boundary region 110 is a fundamental characteristic of the catalytic particle exclusion zone common to both catalytic laminate and catalytic adhesive catalytic layers. For the example particle distribution of particles smaller than 25 u, the catalytic particle boundary is typically 10-12 u below the surface (on the order of half of the length of a catalytic particle), accordingly this depth or greater of surface material must be removed for the embedded catalytic particles to be available for electroless plating. The region from surface 106 to catalytic particles at region 110 and from surface 104 to catalytic particles at region 108 are referred to as catalytic particle exclusion zones in the present application. In one example of the invention, the catalytic particle exclusion zone contains an insufficient density of catalytic particles to enable electroless plating without forming a channel below the catalytic particle exclusion depth. In another example of the invention, the density of catalytic particles in the exclusion zone is less than $\frac{1}{100}$ of the catalytic particle density in non-exclusion zone regions of the catalytic laminate. In another example of the invention, the exclusion zone regions are unable to form continuous conductors through electroless plating in a given duration of time, whereas the regions below the exclusion zone are able to form continuous conductors in the same interval of time.

Prior art catalytic laminates have activated surfaces that must be masked to prevent unwanted electroless plating on the activated surface of the catalytic laminate. By contrast, the catalytic laminate and catalytic adhesives of the present invention exclude catalytic particles over the thickness extent from first surface 104 to first boundary 108, and from second surface 106 to second boundary 110, providing the benefit that a separate mask layer preventing contact with the catalytic particles is not required for electroless plating as it is in the prior art. Accordingly, removal of surface material from either first surface 104 to the depth of boundary layer 108 or deeper, or removal of surface material from second surface 106 to second boundary 110, results in the exposure of catalytic material which may be used for electroless plating. It is also desirable for the process which provides the resin rich surface to also exclude not only catalyst, but the fiber fabric, as removal of the surface layer in subsequent steps which results in the exposure of fibers requires additional cleaning steps, accordingly it is preferred that the surface removal be of resin only, so as to expose only the underlying catalytic particles. This is accomplished by using a combination of resin-rich outer pre-preg layers and flat unwoven fiberglass layers having smaller diameter fibers on the outside layers. An additional advantage of forming traces in channels using electroless plating is that the traces are mechanically supported on three sides, which provides greatly improved trace adhesion to the dielectric laminate.

Figure 2A:
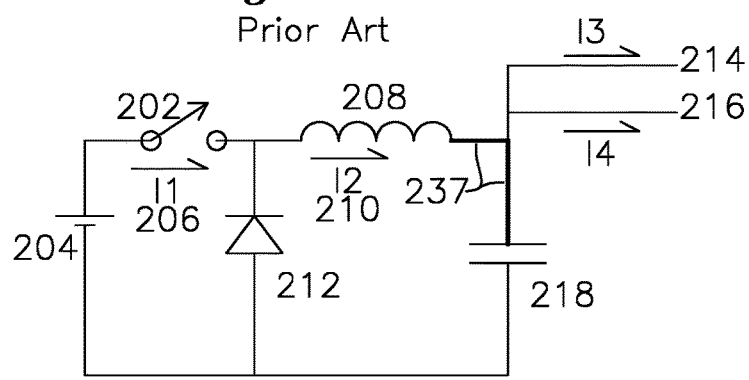
FIG. 2A shows a schematic diagram of a switching power supply circuit with pulsatile current flow in certain components.

FIG. 2A shows a prior art buck regulator circuit. When the switch 202 is closed, inductor charging current flows from the power source 204 through energy storage inductor 208 and to smoothing capacitor 218, increasing the voltage in smoothing capacitor 218. When switch 202 is open, inductor discharge current continues to flow through inductor 208, through the path of diode 212 and capacitor 218. Steady state currents I3 and I4 drawn by load 214 and 216, respectively, are significantly lower than the peak pulsatile current I1 206 through switch 202 or peak pulsatile current I2 210 through inductor 208.

Figure 2B:
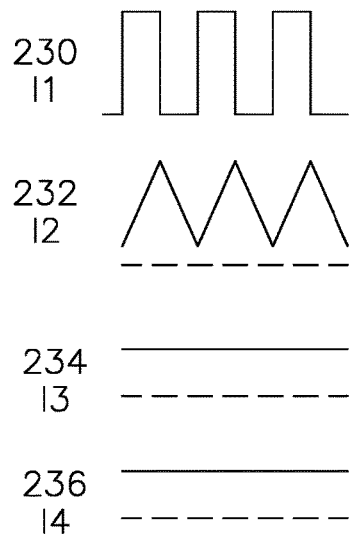
FIG. 2B shows waveform plots for the switching power supply circuit of FIG. 2A.

FIG. 2B shows the current waveform plots 230 for I1 showing the switch opening and closing, Inductor current I2 232, and steady state currents I3 234 and I4 236.

Figure 2C:
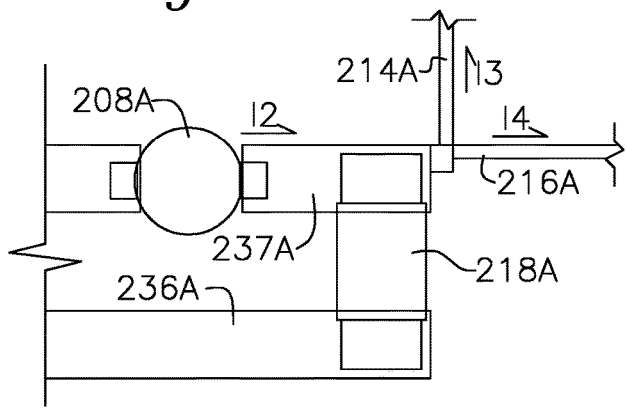
FIG. 2C shows a plan view of a printed circuit board layout for a section of the power supply circuit of FIG. 2A.

FIG. 2C illustrates an example of the effect on a prior art printed circuit board which is designed for pulsatile vs steady state current flows. Inductor 208A corresponds to 208 of FIG. 2A and capacitor 218A of FIG. 2C corresponds to 218 of FIG. 2A. The trace 237A (corresponding to thick line 237 of schematic of FIG. 2A) carries peak pulsatile currents and so must be comparatively wide to reduce $I^2R$ losses associated with I2, whereas the width of the traces 214A and 216A carrying steady state currents I3 and I4 (associated with corresponding lines 214 and 216 of FIG. 2A) may be significantly narrower. Further, it is typically the case that small signal traces are excluded from power supply areas during printed circuit design, to prevent coupling of unwanted transient signals from the pulsatile current flows into the small signal traces by magnetic induction or electrostatic displacement currents through cross-coupling of the traces.

For this reason, it is desired to provide traces which can grow in thickness rather than width, and which can utilize the thickness of two or more layers of a multi-layer circuit board to form the conductive traces.

Figure 3A:
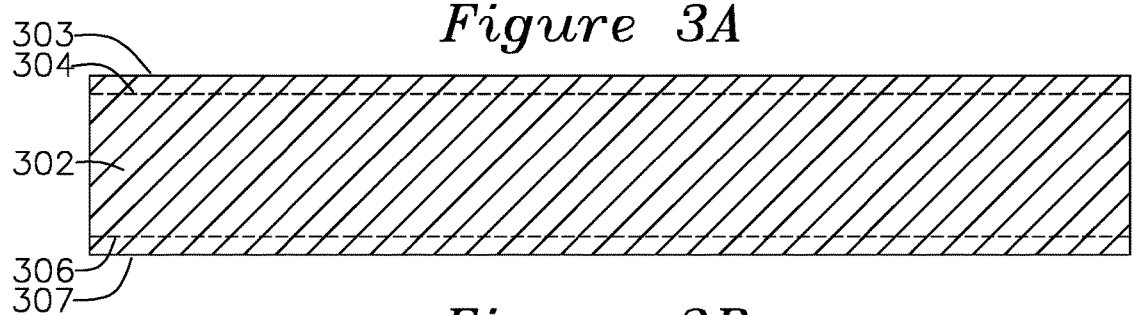
FIG. 3A shows a section view of a catalytic pre-preg laminate layer.

The sequence of FIGS. 3A to 3I shows example process steps for understanding the invention. FIG. 3A shows a cross section view of a catalytic laminate (or catalytic adhesive) 302 with the catalytic particle distribution plot of FIG. 1, where the catalytic particles are distributed throughout the inner regions of the catalytic layer (either a catalytic laminate or catalytic adhesive), and the catalytic particles are below the surface exclusion depth 306 and 304 of the associated outer surfaces, thereby providing a density of catalytic particles from 304 to 306 which is sufficient to provide electroless deposition of conductive metal such as copper in regions which extend below the surface catalytic particle exclusion zone, and to exclude electroless deposition at native surfaces 303 or 307.

Catalytic particles (not shown) in the region between 304 and 306 may be in the size range of 25 u and smaller, in the present example they may be in the range 12 u to 25 u. The catalytic particles may include heterogeneous catalytic particles (organic or inorganic particles having a catalytic surface coating) or homogeneous particles (catalytic metal particles), as described previously. The exclusion boundary 304 is approximately 25 u below the first surface 303. The second surface 307 and second surface exclusion boundary 306 on the opposite surface are shown for reference, but it is understood that the process may be used on one or both sides of a candidate catalytic laminate or catalytic adhesive.

Figure 3B:
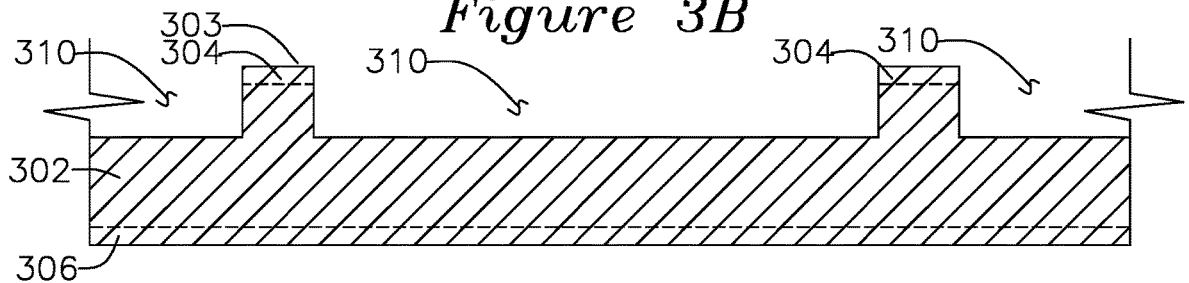
FIG. 3B shows FIG. 3A after formation of channels in a surface layer.

FIG. 3B shows the laminate of FIG. 3A with a channel 310 formed by removal of the surface layer 303 below exclusion zone 304 in a region where a trace is desired. The removal of surface material to form channels in the catalytic laminate or catalytic adhesive 302 may be by laser ablation, where the temperature of the catalytic pre-preg is instantly elevated until the catalytic pre-preg is vaporized, while leaving the surrounding catalytic pre-preg structurally unchanged, leaving the catalytic particles exposed. It may be preferable to use a laser with a wavelength with a low reflectivity and high absorption of this optical wavelength for the pre-preg material being ablated, such as ultraviolet (UV) wavelengths. Examples of such UV lasers are the UV excimer laser or yttrium-aluminum-garnet (YAG) laser, which are also good choices because of the narrow beam extent and high available power which for forming channels of precise mechanical depth and with well-defined sidewalls. An example laser may remove material in a 0.9-1.1 mil (23 u to 28 u) diameter width with a depth governed by laser power and speed of movement across the surface. Another surface removal technique for forming channel 210 is plasma etching, which may be done locally or by preparing the surface with a patterned mask which excludes the plasma from the surface layers 206 or 205, such as a dry film photoresist or other mask material which has a low plasma etch rate compared to the plasma etch rate of catalytic pre-preg. The photoresist thickness is typically chosen based on epoxy/photoresist etch selectivity (such that plasma etch to the desired depth of removal of the cured epoxy leaves sufficient photoresist at the end of the etch), or in the case of photoresist which is used as an electroplate mask, the thickness is chosen according to desired deposition thickness. Typical dry film thickness is in the range of 0.8-2.5 mil (20-64 u). Plasmas suitable for etching the resin rich surface include mixtures of oxygen (O) and $CF_4$ plasmas, mixed with inert gasses such as nitrogen (N), or argon (Ar) may be added as carrier gasses for the reactive gases. A mask pattern may also be formed with a dry film mask, metal mask, or any other type of mask having apertures. Where a mechanical mask is used, the etch resist may be applied using any of photolithography, screen printing, stenciling, squeegee, or any method of application of etch resist. Another method for removal of the surface layer of catalytic pre-preg is mechanical grinding, such as a linear or rotational cutting tool. In this example, the catalytic pre-preg may be secured in a vacuum plate chuck, and a rotating cutter (or fixed cutter with movable vacuum plate) may travel a pattern defining the traces such as defined by x,y coordinate pairs of a Gerber format photofile. In another example of removing surface material, a water cutting tool may be used, where a water jet with abrasive particles entrained in the stream may impinge on the surface, thereby removing material below the first boundary 304. Any of these methods may be used separately or in combination to remove surface material and form channel 310 from catalytic pre-preg 302, preferably with the channel extending below the first boundary 304. Accordingly, the minimum channel depth is the depth required to expose the underlying catalytic particles, which is a characteristic of the cured pre-preg. As the catalytic material is dispersed uniformly through the cured pre-preg below the exclusion boundary 304, the maximum channel depth may be limited by the depth of the woven fiber (such as fiberglass) fabric, which tends to complicate channel cleaning, as the fibers may break off and re-deposit in channels intended for electroless plating, or otherwise interfere with subsequent process steps. Typical channel depths are 1 mil (25 u) to 2 mil (70 u), but may extend deeper into the prepreg for reduced electrical resistance after electroless deposition. The final step after removing the surface material to form the channel 310 is to clean away any particles of material which were removed, which may be accomplished using ultrasound cleaning, jets of water mixed with surfactant, or any other cleaning means which does not result in surface 304 material surrounding the channel from being removed. Alternatively, the use of a catalytic adhesive, which may be applied to the underlying catalytic layer and cured, and contains no fabric, may be preferable for deep channels extending through a single layer, as there are no remaining fibers after ablation or channel formation to interfere with subsequent deposition steps.

Figure 3C:
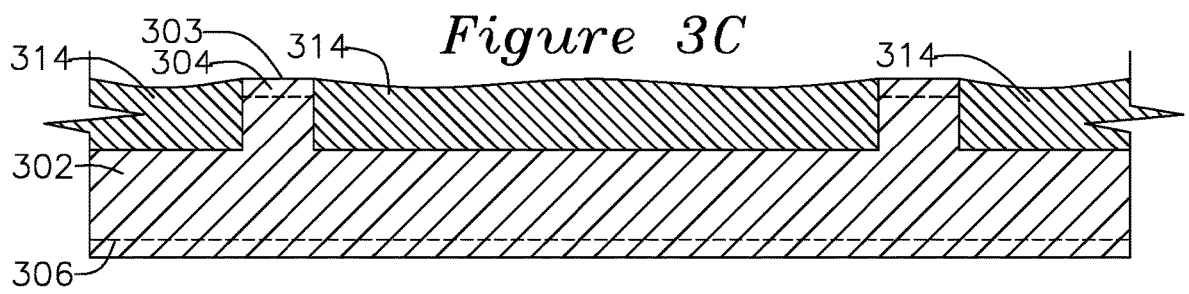
FIG. 3C shows FIG. 3B after deposition of metal traces such as by electroless deposition.
Figure 3D:
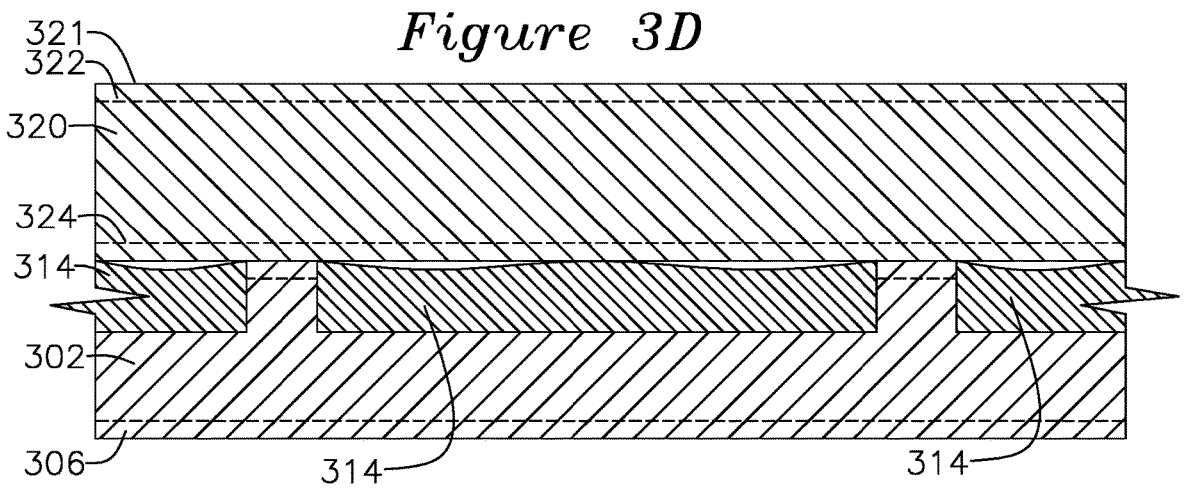
FIG. 3D shows FIG. 3C after bonding or lamination of a second catalytic pre-preg layer to a previous catalytic pre-preg layer.

FIG. 3C shows an electroless deposition 314 step, which is allowed to progress until the deposition approximately reaches the upper surface 303, which allows for application of a subsequent layer of catalytic layer (which may be a catalytic laminate or catalytic adhesive) 320 shown in FIG. 3D. Catalytic layer 320 also has associated surface catalytic particle exclusions depth 322 and 324, as did the catalytic layer 302 previously described. The use of catalytic adhesive for catalytic layer 320 is preferred to avoid interference between unablated or remaining fibers in the channel after the channels 326 are formed of FIG. 3E, which may interfere with the subsequent electroless copper deposition 329 of FIG. 3F. The subsequent layer of catalytic layer 320 may be bonded or laminated to the adjacent catalytic layer 302 and electroless deposition 314 of FIG. 3D using vacuum lamination or other process for layer bonding or lamination known in PCB fabrication prior art.

Figure 3E:
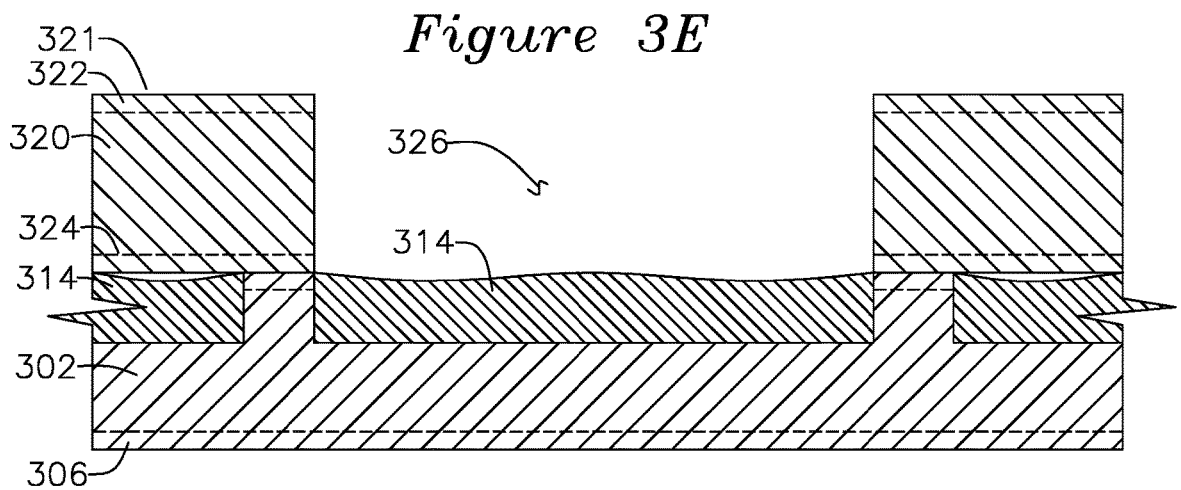
FIG. 3E shows FIG. 3D after forming a channel with a depth through the thickness of pre-preg which reaches the electroless deposition of the first layer applied in FIG. 3C.

FIG. 3E shows the removal of catalytic layer 326 through the depth of catalytic layer 320 using the previously described method from the surface 321 of catalytic layer 320 through to the underlying electroless deposition 314 of the first layer 302. The formation of the channel 326 may be done using any known method for removing laminate, although laser ablation is preferred.

Figure 3F:
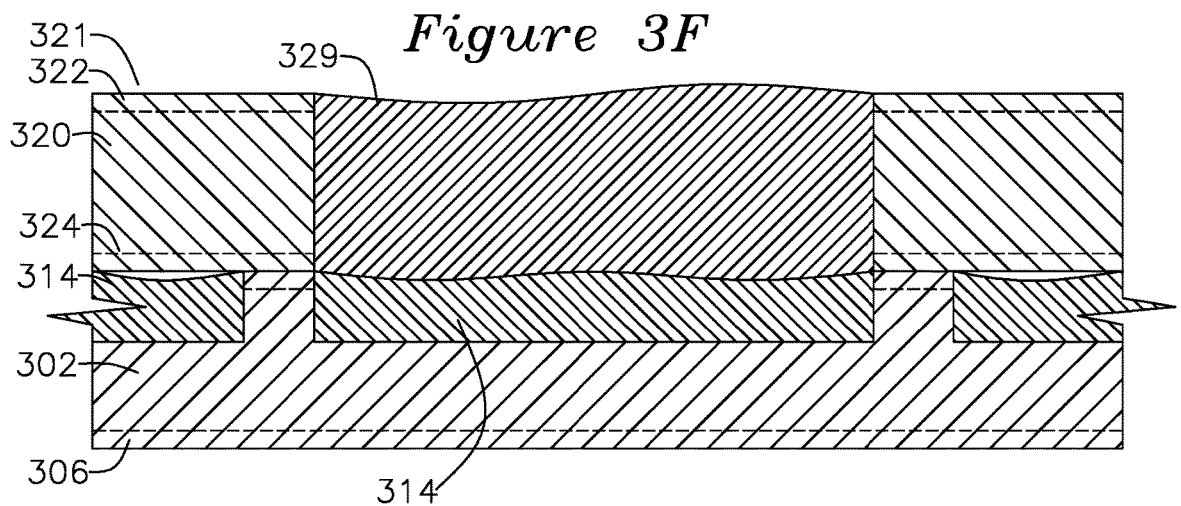
FIG. 3F shows FIG. 3E after electroless deposition of a metal which is in contact with the electroless deposited trace of FIG. 3C.

FIG. 3F shows electroless plating 329 of the channel 326 from the deposition 314 below to the top level 321 of the catalytic layer 320. The resulting circuit board now has a homogeneous trace with a trace thickness which is greater than the thickness of a single catalytic layer 320 or 302. The circuit board may be used in a finished form of FIG. 3F in this manner after the addition of components. High current trace segments, such as trace segment 320 of FIG. 2C, may have its resistance reduced using the current method, and additional layers may be bonded or laminated to continue the process and increase the depth of the trace segment, as shown in FIG. 3G where catalytic layer 332 (where first exclusion surface 330 and second exclusion surface 334 may be present, as before).

Figure 3G:
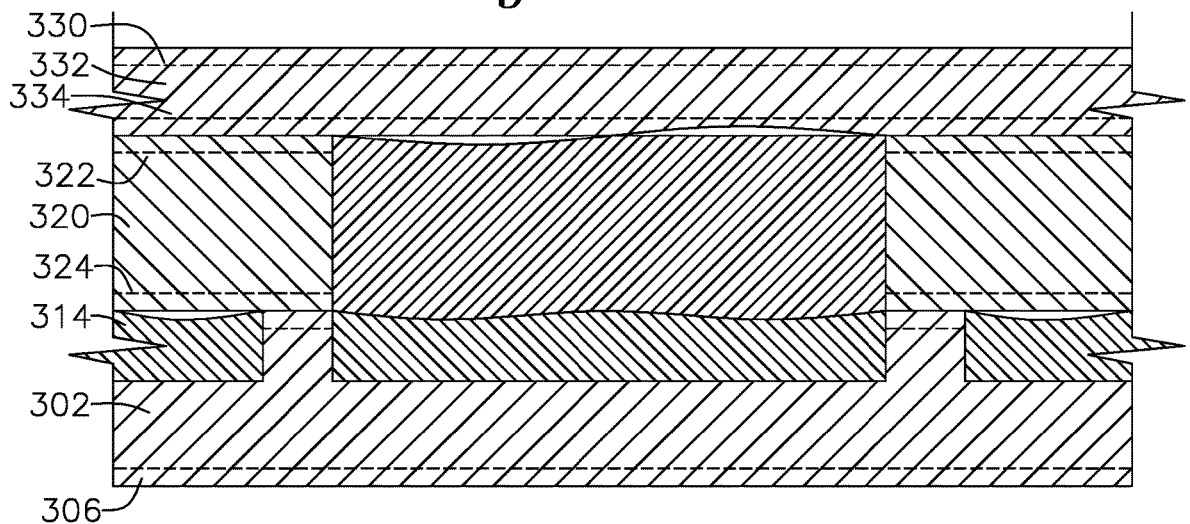
FIG. 3G shows an optional additional step of adding a catalytic layer to the laminate of FIG. 3F.
Figure 3H:
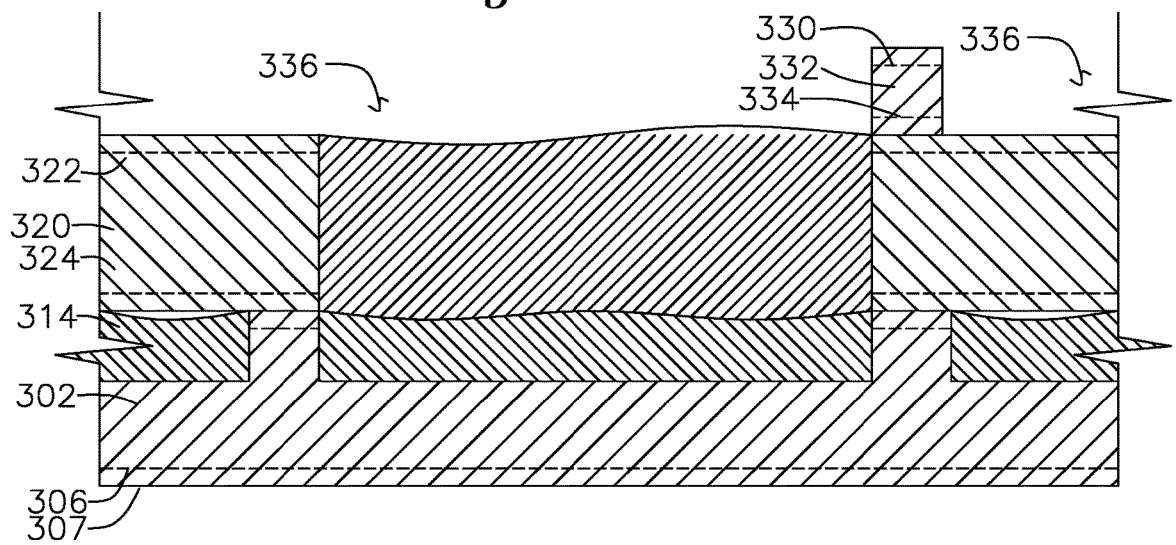
FIG. 3H shows FIG. 3G after forming a channel to the catalytic layer added in FIG. 3G.
Figure 3I:
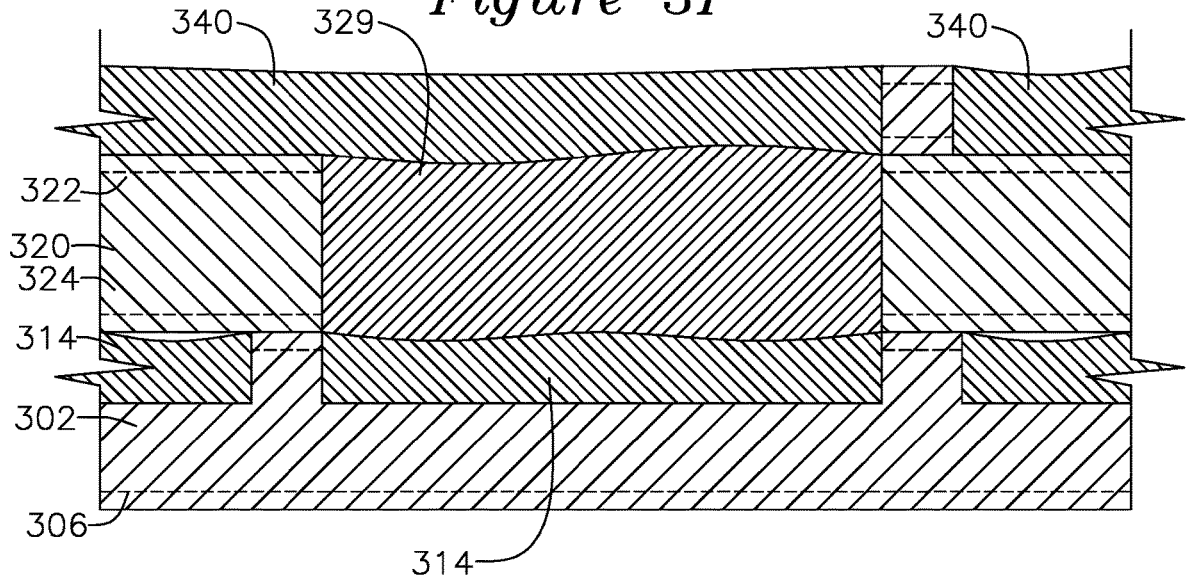
FIG. 3I shows FIG. 3G after electroless deposition of a metal which is in contact with the electroless deposited trace of FIGS. 3C and 3H.

FIG. 3H shows the subsequent step of forming channel 336 in catalytic layer 332 of FIG. 3G. FIG. 3I shows a final step, where electroless deposition of metal 340 is in electrical contact with previous electroless depositions 329 and 314, thereby providing a method for forming a low resistance elongate conductor of selectable thickness, which can be narrower than allowed by the prior art for a given deposition metal resistivity (which translates to resistance per inch for a given trace thickness and width) of trace having a greater depth than provided in the prior art. Although boundaries are shown between trace deposition layers 314, 329, and 340 for clarity in understanding the steps of the process and resulting circuit, the electroless metal deposition is homogeneous across layers, providing a low resistance trace which spans the several dielectric layers and without the boundaries shown in the figures.

Electroless plating for 329 of FIG. 3F and 314 of FIG. 3C may be performed several different ways. One example electroless copper bath formulation uses a mixture of Rochelle salt as the complexing agent, copper sulfate as the copper metal source, formaldehyde as the reducing agent, and sodium hydroxide as a reactant. In this example, the tartrate (Rochelle salt) bath is preferred for ease of waste treatment; the Rochelle salt does not chelate as strongly as alternatives such as EDTA or quadrol. In this example, the tartrate (Rochelle salt) is the completing agent, copper sulfate is the metal source, formaldehyde is the reducing agent, and sodium hydroxide is a reactant. Other electroless plating formulations are possible, this example is given for reference. The electroless plating initially forms over the surfaces of the exposed catalytic particles and progresses until the deposition is below the native outer surfaces of the catalytic layer.

A key advantage of electroless plating of channels etched in catalytic material is that the electroless plating progresses on all three sides at once, compared to electroplating which only progresses from a bottom (initially plated) layer.

FIG. 4 shows a series of process steps for using catalytic layers (catalytic adhesive or catalytic laminate) to form circuit boards with trace layers having a thickness greater than a single laminate layer thickness. Apertures (if needed) are formed in step 402 such as for interlayer vias (not shown but well known in the prior art), followed by channels in step 404 such as channel 310 of FIG. 3B. Electroless plating is performed in step 406 corresponding to 314 of FIG. 3C, and a series of steps 408, 410, and 412 are iteratively performed as needed for each layer of laminate/channel/electroless plate to extend the thickness of the electroless deposition of step 406. Step 408 corresponds to the bonded or laminated subsequent layers 320 of step 3D and layer 332 to 302 of step 3G. Step 410 corresponds to the formation of channels 326 of FIG. 3E or 336 of FIG. 3H. Step 412 corresponds to the electroless plating 329 of FIG. 3F or 340 of FIG. 3I. The process of adding additional layers to further extend the thickness of the traces may be performed by the path 414 following step 412 for each iteration.

The preceding description is only to provide examples of the invention for understanding the underlying mechanisms and structures used, and is not intended to limit the scope of the invention to only the particular methods or structures shown. For example, the sequences of FIGS. 3A to 3I show a single sided construction with the trace channels formed over a plurality of catalytic layers built above a first layer 302, whereas the first catalytic layer 302 may have surface 307 subsequently ablated to the level of electroless deposition 314 and additional layers added to surface 307 in the opposite direction using convention methods of multi-layer boards, or the method for extending the trace thickness described above.

The trace structures of FIGS. 3A to 3I are shown in combination as they would normally occur on a PCB, these examples are only for illustration, and are not intended to limit the invention to these constructions. The result of using the present invention for the example given in FIGS. 2A and 2C is that if trace 237A is 0.25" wide and 3 mil thick for a conventional subtractive circuit board process, and the top and underlying catalytic layers 15 mil thick (30 mil total) were used to form the trace described in FIGS. 3A to 3I, then trace 237 could be reduced from 250 mil to 25 mil width.

In the present specification, "approximately" is understood to mean less than a factor of 4 greater or smaller than a given nominal value, "substantially" is understood to mean less than a factor of 2 greater or smaller than a given nominal value. "Order of magnitude" of a value includes the range from 0.1 times the nominal value to 10 times the nominal value.

Certain post-processing operations are not shown which are generic to printed circuit board manufacturing and may be performed using prior art methods on boards produced according to the novel process. Such operations include tin plating for improved solder flow, gold flash for improved conductivity and reduced corrosion, soldermask operations, silkscreening information on the board (part number, reference designators, etc.), scoring the finished board or providing breakaway tabs, etc. The circuit board formed using the current process has a planar surface compared to the prior art of subtractive copper etching which leaves an elevated trace on top of a lower underlying substrate. Certain of these operations may produce improved results when performed on the co-planar trace and substrate surfaces of the present invention. For example, silkscreened lettering over traces or vias traditionally breaks up because of trace and via thickness over the board surface, whereas these operations would provide superior results on a planarized surface.

We claim:

1. A process for forming a circuit board, the process comprising:
    forming a channel having a width and a depth into a first catalytic layer;
    electroless plating a conductive trace into the first catalytic layer to approximately the depth of the channel of the first catalytic layer;
    for at least one subsequent layer:
        laminating a subsequent catalytic layer to a previously applied layer;
        forming a channel into the subsequent catalytic layer to a depth which reaches the conductive trace of a previous catalytic layer;
        electroless plating a conductive trace into the subsequent catalytic layer, the electroless plating in electrical contact with the conductive trace of a previous catalytic layer.

2. The process of claim 1 where at least one catalytic layer is formed using heterogeneous catalytic particles.

3. The process of claim 2 where the heterogeneous catalytic particles are an inorganic material coated with a catalyst.

4. The process of claim 2 where the heterogeneous catalytic particles are an inorganic material coated with a catalyst.

5. The process of claim 1 where the electroless deposition is copper.

6. The process of claim 1 where the catalytic particles are palladium with the majority of the particles having a maximum dimension less than 25 u.

7. The process of claim 1 where at least one of the first catalytic layer or a subsequent catalytic layer is a catalytic adhesive or a catalytic laminate.

8. A process for forming a multi-layer circuit board, the process comprising:
    forming a first catalytic layer, including forming a conductive trace in a channel, the conductive trace formed by electroless deposition;
    applying, bonding, or laminating a second catalytic layer to the first catalytic layer, the second catalytic layer having a channel formed through a thickness of the second catalytic layer and extending in depth to the conductive trace of the first catalytic layer;
    filling the channel of the second catalytic layer with a conductive metal by electroless deposition, the second catalytic layer electroless deposition in contact with the electroless deposition of the first catalytic layer.

9. The process of claim 8 where a catalytic layer of the first or second layer is formed using heterogeneous catalytic particles.

10. The process of claim 9 where the heterogeneous catalytic particles are an inorganic material coated with a catalyst.

11. The process of claim 8 where the first catalytic layer or the second catalytic layer contains at least one of: palladium (Pd), platinum (Pt), rhodium (Rh), iridium (Ir), nickel (Ni), gold (Au), silver (Ag), cobalt (Co), or copper (Cu), or compounds therein which may include other metals such as iron (Fe), manganese (Mn), chromium (Cr), molybdenum (Mo), tungsten (W), titanium (Ti), tin (Sn), or mixtures or salts therein.

12. The process of claim 8 where the first catalytic layer or the second catalytic layer contains palladium salts including at least one of: $BrPd$, $CL_2Pd$, $Pd(CN)_2$, $I_2Pd$, $Pd(NO_3)_2*2H_2O$, $Pd(NO_3)_2$, $PdSO_4$, $Pd(NH_3)$ $4Br_2$, $Pd(NH_3)$ $4Cl_2H_2O$.

13. The process of claim 8 where the first catalytic layer or the second catalytic layer includes a resin containing at least one of: polyimide resin, or blend of epoxy and cyanide ester.

14. The process of claim 8 where at least one of the first catalytic layer or the second catalytic layer is a catalytic adhesive or a catalytic laminate.

15. A process for forming a multi-layer circuit board comprising:
    forming at least one trace in a channel which spans the thickness of more than one layer, the at least one trace formed in a channel being contiguous with at least one other trace formed in a channel on an adjacent layer.

16. The process of claim 15 where the catalytic layer is formed using heterogeneous catalytic particles, the majority of the particles smaller than approximately 25 u.

17. The process of claim 15 where the catalytic layer contains at least one of: palladium (Pd), platinum (Pt), rhodium (Rh), iridium (Ir), nickel (Ni), gold (Au), silver (Ag), cobalt (Co), or copper (Cu), or compounds therein which may include other metals such as iron (Fe), manganese (Mn), chromium (Cr), molybdenum (Mo), tungsten (W), titanium (Ti), tin (Sn), or mixtures or salts therein.

18. The process of claim 15 where the catalytic material contains heterogeneous catalytic particles comprising an inorganic material coated with a catalyst.

* * * * *